United States Patent [19]

Lyon

[11] Patent Number: 5,502,663
[45] Date of Patent: Mar. 26, 1996

[54] DIGITAL FILTER HAVING INDEPENDENT DAMPING AND FREQUENCY PARAMETERS

[75] Inventor: Richard F. Lyon, Los Altos, Calif.

[73] Assignee: Apple Computer, Inc., Cupertino, Calif.

[21] Appl. No.: 319,524

[22] Filed: Oct. 7, 1994

Related U.S. Application Data

[62] Division of Ser. No. 990,666, Dec. 14, 1992, Pat. No. 5,355,329.

[51] Int. Cl.$^6$ .................................................... G06F 15/31
[52] U.S. Cl. ........................................................ 364/724.01
[58] Field of Search ......................... 364/724.01, 724.17, 364/724.19; 375/103

[56] References Cited

U.S. PATENT DOCUMENTS

| | | | |
|---|---|---|---|
| 4,146,931 | 3/1979 | Delforge | 364/724.17 |
| 4,185,325 | 1/1980 | Appel | 364/724.17 |
| 4,337,518 | 7/1982 | Ohnishi et al. | |
| 4,356,559 | 10/1982 | Candy et al. | |
| 4,803,647 | 2/1989 | Dieterich | 364/724.17 |
| 5,031,132 | 7/1991 | Dolazza | 364/724.12 |
| 5,170,369 | 12/1992 | Rossum | |
| 5,315,621 | 5/1994 | Lucioni et al. | 364/724.19 |

OTHER PUBLICATIONS

"*ASIC Implementation of the Lyon Cochlea Model*" by C. D. Summerfield and R. F. Lyon, in Proc. International Conference on Acoustics, Speech, and Signal Processing, IEEE, 1992.

Primary Examiner—Tan V. Mai
Attorney, Agent, or Firm—Blakely, Sokoloff, Taylor & Zafman

[57] ABSTRACT

A filter capable of having its damping and frequency parameters independently varied. The filter can be represented in either a digital or an analog computation network. The network comprises four multipliers for multiplying by a frequency term twice and a damping factor twice. In addition, the network comprises two unit delay blocks for temporarily storing previous signal input values for zeros or output values for poles. These stored values are used in computing subsequent outputs. The multipliers are configured with adders and subtractors to compute a next output value as a combination of a current input, a weight $-2+2df+f^2-wd^2f^2$ times the most recent saved value and a weight $1-2df+wd^2f^2$ times the previous saved value. Moreover, unity gain at DC can be achieved.

14 Claims, 15 Drawing Sheets

DIGITAL FILTER HAVING INDEPENDENT DAMPING AND FREQUENCY PARAMETERS

This is a divisional of application Ser. No. 07/990,666, filed Dec. 14, 1992, now U.S. Pat. No. 5,355,329.

FIELD OF THE INVENTION

The present invention pertains to the field of digital filters. Specifically, the present invention relates to digital filters having independent damping and frequency parameters, which can be applied to a wide range of signal processing functions.

BACKGROUND OF THE INVENTION

The human hearing process is intimately related to the function of the cochlea. The cochlea is a spiral tube in the inner ear resembling a snail shell. It has nerve endings which translate incoming pressure signals to neural signals. The cochlea is essential to the hearing process.

As can be expected, electronic models simulating the cochlea's functions are widely studied by the speech and hearing research community in order to develop speech synthesis, analysis, and recognition systems. One of the long term attractions of cochlea model based signal processing is the promise of increased recognition performance, especially in variable and high noise environments.

In the past, models were based on the mechanical motion of the cochlea's basilar membrane to various degrees of fidelity. These types of algorithms have demonstrated a degree of restricted recognition. However, these prior art approaches often failed to effectively handle sounds other than pure, simple speech sounds. Consequently, increasingly complex models are being designed in an effort to distinguish between complex single sounds and separate unfusible sounds with similar short-term spectra. One goal is to design an extremely precise model such that these different types of sounds can accurately and reliably be decoded.

For example, some models employ cascaded filter sections to mimic the behavior of the cochlea to preserve those aspects of sound most relevant to sound separation and speech parametedzation. In this respect, digital models and hence, digital filters, are attractive because of their suitability for implementation in many digital computer architectures.

A digital filter is characterized in the z domain by the z-plane complex number locations of its poles (i.e., roots of the denominator of its z-transform transfer function), its zeros (i.e., roots of the numerator of its z-transform transfer function), and by a gain parameter. The "order" of the filter is the highest exponent of z in either the numerator or the denominator of its transfer function. It is sufficient to analyze quadratic filters having an order of two, with complex conjugate pairs of poles and zeros, referred to as second-order sections, and to filters having an order of one, with real poles and zeros, referred to as first-order sections, because these sections can be cascaded with other similar sections to make arbitrary filters of higher order.

A second-order section with complex poles and zeros can be characterized by the frequency and damping of its poles and zeros. For most purposes, second-order filters can be considered to have only poles or zeros, rather than both. Consequently, the frequency and damping of second-order filters can be characterized by a complex pair of poles or a complex pair of zeros. A second-order filter that combines poles and zeros is said to be bi-quadratic and has separate frequency and damping parameters for its poles and for its zeros. A filter with poles is said to be recursive, since it uses feedback of previously computed values to compute subsequent values. A filter with only zeros is said to be nonrecursive, since it has no feedback loop. The art of digital filters is well described in recent textbooks, including *Discrete-Time Signal Processing* by A. V. Oppenheim and R. W. Schafer, Prentice Hall, Englewood Cliffs, N.J., 1989. One skilled in the art will realize that digital filters can also be applied to discrete-time analog implementations, such as by using charge-coupled devices.

Ideally, to model nonlinear adaptation in the cochlea, digital filters should have adaptable damping characteristics. Damping relates to the temporal rate of decay of a filter's impulse response, and is related to the Q or quality factor as $d=1/(2Q)$. It is highly preferable for the damping factor of a digital filter to be capable of being controlled and varied. This can be accomplished by selecting a particular filter form and calculating the filter coefficients based on the desired damping and frequency parameters. However, these calculations tend to be quite complicated and usually involve trigonometric functions, square roots, etc., which are non-linear.

When these filters are implemented in systems operating in real time at relatively fast sample rates (e.g., 20 kilohertz), complications arise. Each time the damping is changed, the filter is typically required to repeat the complex calculations, which imposes a high cost in terms of hardware units and/or computation cycles. Hence, typical prior art digital filters lack the speed to vary the parameters for each sample in real time. Instead, the complicated calculations for changing the filter parameters are performed only periodically. As a result, the filter parameters change in incremental jumps, rather than changing smoothly over time. This compromise results in a non-ideal real-time implementation.

In addition, many prior art digital filters with simple structures exhibit high coefficient sensitivity. In other words, frequency and damping parameters must be very precisely converted to filter coefficients in order to assure that the resulting filter frequency and damping match the desired parameters to a high degree of accuracy. However, to mimic the cochlea, one would like to have a digital filter directly controlled by frequency and damping parameters, wherein its parameters can be varied independently in real time without affecting other parameters. Moreover, it would be highly advantageous for such a filter to also exhibit low sensitivity to small errors in the parameters.

A technique recently published in "ASIC Implementation of the Lyon Cochlea Model" by C. D. Summerfield and R. F. Lyon in *Proc. Int'l Conf. on Acoustics, Speech, and Signal Processing*, IEEE, 1992, is a first step toward the goals set forth above, but it suffers from very extreme overdamping and even instability when frequency and damping parameters are both set significantly above zero.

Therefore, what is needed is a digital filter which can be implemented in real-time in a relatively economical fashion. It would be highly preferable if the filter's center frequency and damping parameters can both be independently varied over a wide range.

SUMMARY OF THE INVENTION

The present invention may be implemented in a computer model simulation and in an application-specific signal processor, a custom semiconductor chip. Second-order filters can be paired with first-order filters to make third-order filters.

Second-order recurslye filters are used to filter input signals representative of sound stimuli. The filters are capable of having their damping and frequency parameters independently varied. Furthermore, unity gain can be achieved for DC (i.e., zero frequency), as needed for propagating low frequencies to later filter stages.

The filters can be represented in either a digital or an analog computation network. The network comprises four multipliers for multiplying twice by a frequency parameter, f, and twice by a damping parameter, d. In addition, the network comprises two unit delay blocks for temporarily storing previous signal input values (for zeros) or output values (for poles), which are used in computing subsequent outputs. The multipliers are configured with adders and subtractors to compute a next output value as a combination of a current input, for example, a weight, $-2+2df+f^2-wd^2f^2$, times the most recent saved value and a weight, $1-2df+wd^2f^2$, times the previously saved value.

BRIEF DESCRIPTION OF THE DRAWINGS

The present invention is illustrated by way of example, and not by way of limitation, in the figures of the accompanying drawings and in which.

DETAILED DESCRIPTION

A digital filter having independent damping and frequency parameters is described. In the following description, for purposes of explanation, numerous specific details such as pole pair positions, frequencies, damping factors, critical coefficients, etc., are set forth in order to provide a thorough understanding of the present invention. It will be apparent, however, to one skilled in the art that the present invention may be practiced without these specific details. In other instances, well-known structures and devices are shown in block diagram form in order to avoid unnecessarily obscuring the present invention.

Figure 1:
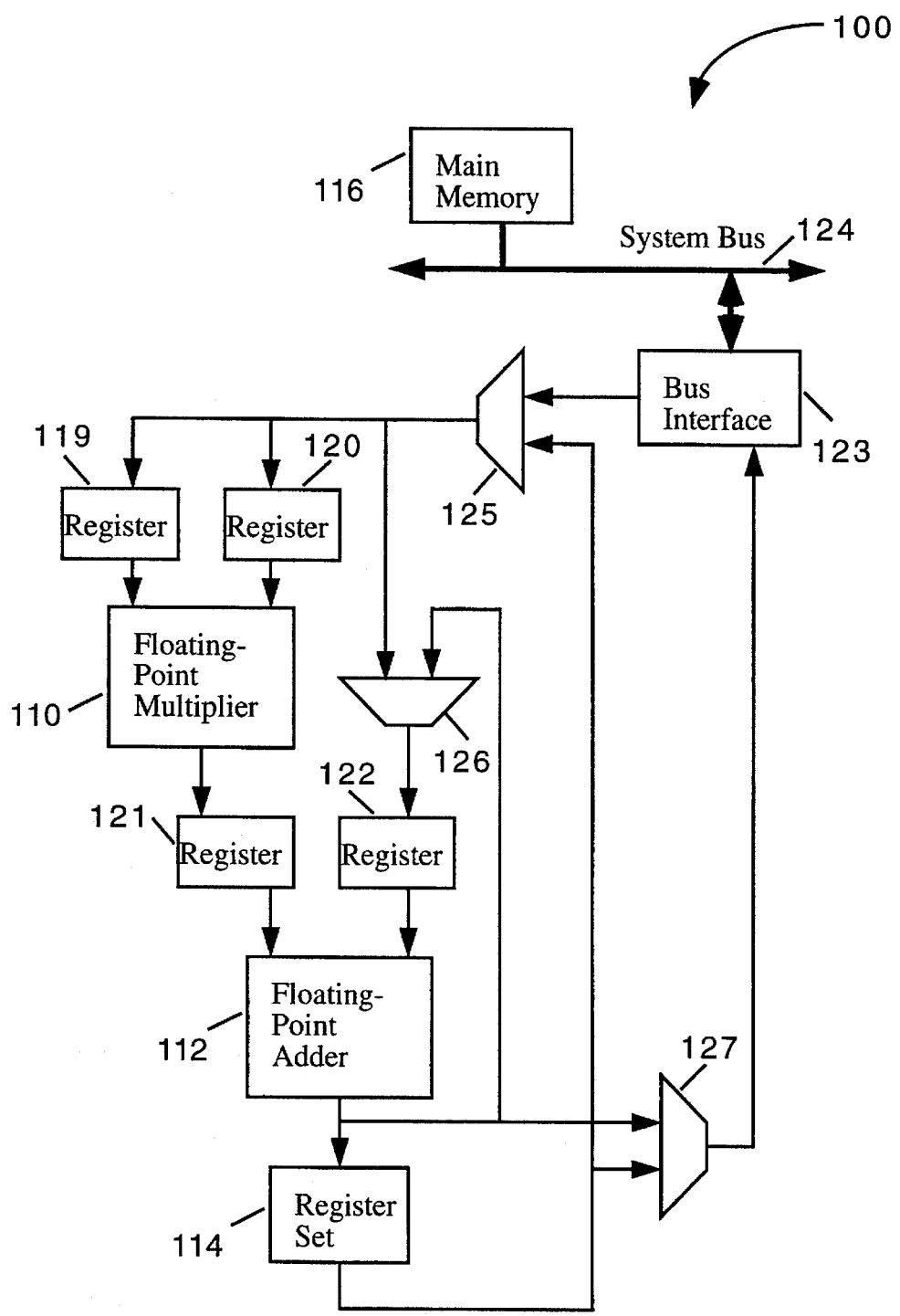
FIG. 1 is a block diagram illustrating a computer system, known as a digital signal processor (DSP), upon which the present invention can be implemented.

Referring to FIG. 1, a computer system 100 upon which the preferred embodiment of the present invention can be implemented is shown. Computer system 100 is a typical structure which includes a specialized computer chip known as a digital signal processor (DSP), such as the AT&T DSP32C®, although alternative programmable computing systems could be used in implementing the present invention. Important known computational resources for digital filter implementation include multipliers, adders, and means for efficient access to stored data. A Floating Point Multiplier 110 and a Floating Point Adder 112 can be utilized. In other embodiments, fixed point arithmetic operators are also adequate in many applications. Register Set 114 typically holds 16 or 32 floating point intermediate values. Additional elements include internal data pathways, multiplexors 125–127 for steering data values onto pathways, temporary data registers 119–122, and an interface 123 to a system bus 124 to access additional memory and other system resources for input and output of signal data and control data. One skilled in the art will understand that there is a wide range of possible hardware implementations of digital filters, from the programmed control of a single multiplier and a single adder, as shown in FIG. 1, through a fully hardwired interconnection of dedicated multipliers, adders, and memory elements.

Figure 2:
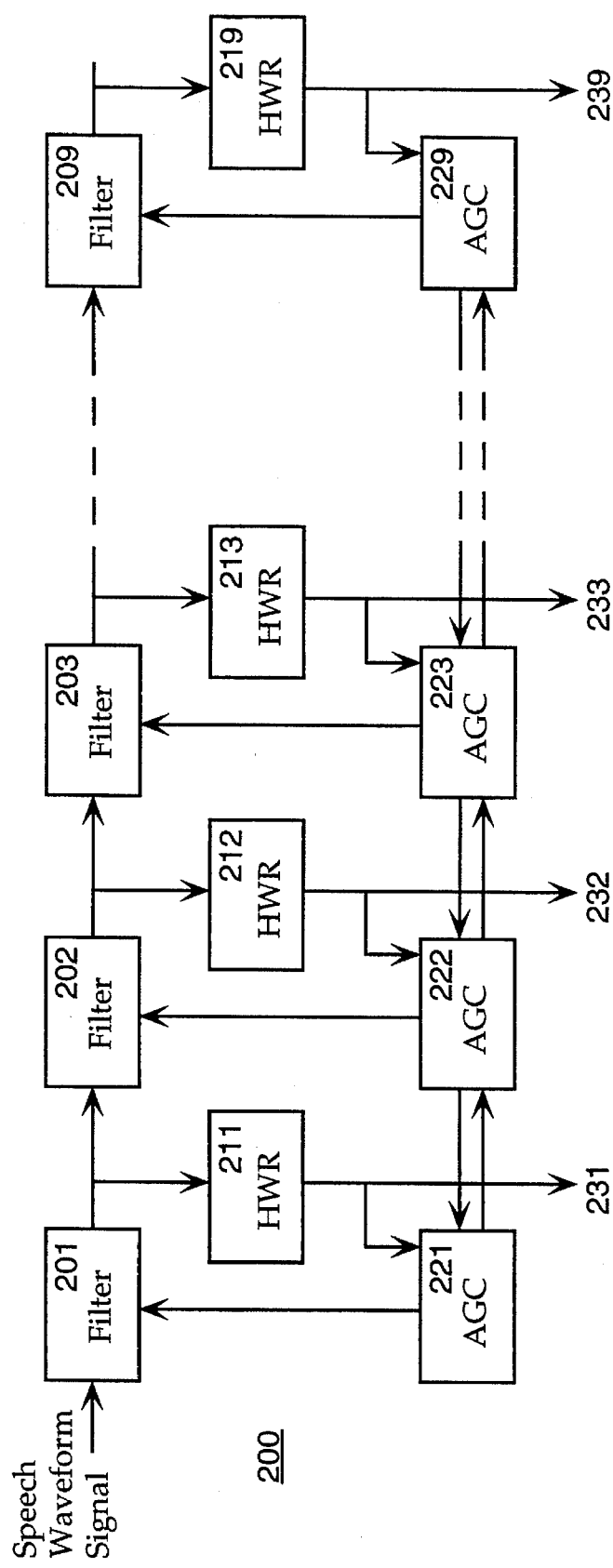
FIG. 2 is a block diagram illustrating an electrical circuit simulating a cochlea model utilizing the present invention.

FIG. 2 is a block diagram illustrating a cochlea model 200 upon which the present invention can be utilized. The frequency selective displacement characteristic of the cochlea's basilar membrane is modeled by serially coupling together a plurality of second-order filters 201–209. Each node in the filter chain is tapped and coupled to a half-wave rectifier (HWR) 211–219 to model the hair cell response. Each HWR output is further processed by individual automatic gain control (AGC) circuits 221–229. The AGC network models the variations in basilar membrane damping as a function of its recent average displacement amplitude.

Each AGC circuit is an interconnection of simple smoothing filters that average the HWR outputs over time and over space via interconnections between channels. The outputs of the AGC, circuits are used to modify the damping of the corresponding basilar membrane filters, to approximately model nonlinear adaptation of basilar membrane mechanics, including effects known as two-tone suppression and forward masking.

The biological cochlea operates in continuous time, but digital computer models inherently operate in discrete time steps. The description of continuous-time filters by pole and zero locations in the complex s-plane using Laplace transform techniques is a well known art. The positions of complex poles and zeros am conventionally described by a natural frequency, f, expressed in radians per second, which is equal to the modulus (radius) of the complex position in the s plane and a nondimensional damping factor, d, equal to the ratio of the negative real part of the complex position to the natural frequency, f.

There is no such universally accepted definition of natural frequency and damping for discrete-time filters in terms of positions in the complex z-plane corresponding to z-transform techniques. The terms frequency and damping are still generally understood, but the interaction with the sampling rate of the discrete-time filter complicates the definition. Hence, a transformation to map positions in the s-plane to positions in the z-plane, according to some acceptable mapping, is implemented. One such popular mapping, known as the impulse-invariance method, maps poles and zeros from s to z via the formula z=exp(sT), where T is the sampling interval and exp() is the complex exponential function. To simplify the notation, we will take T to be 1 second, or equivalently treat the frequency parameter f as radians per sample instead of radians per second; then the ideal mapping according to this method is z=exp(s). In the discussion to follow, note that all the techniques pertaining to poles can be equally applied to zeros.

Figure 3:
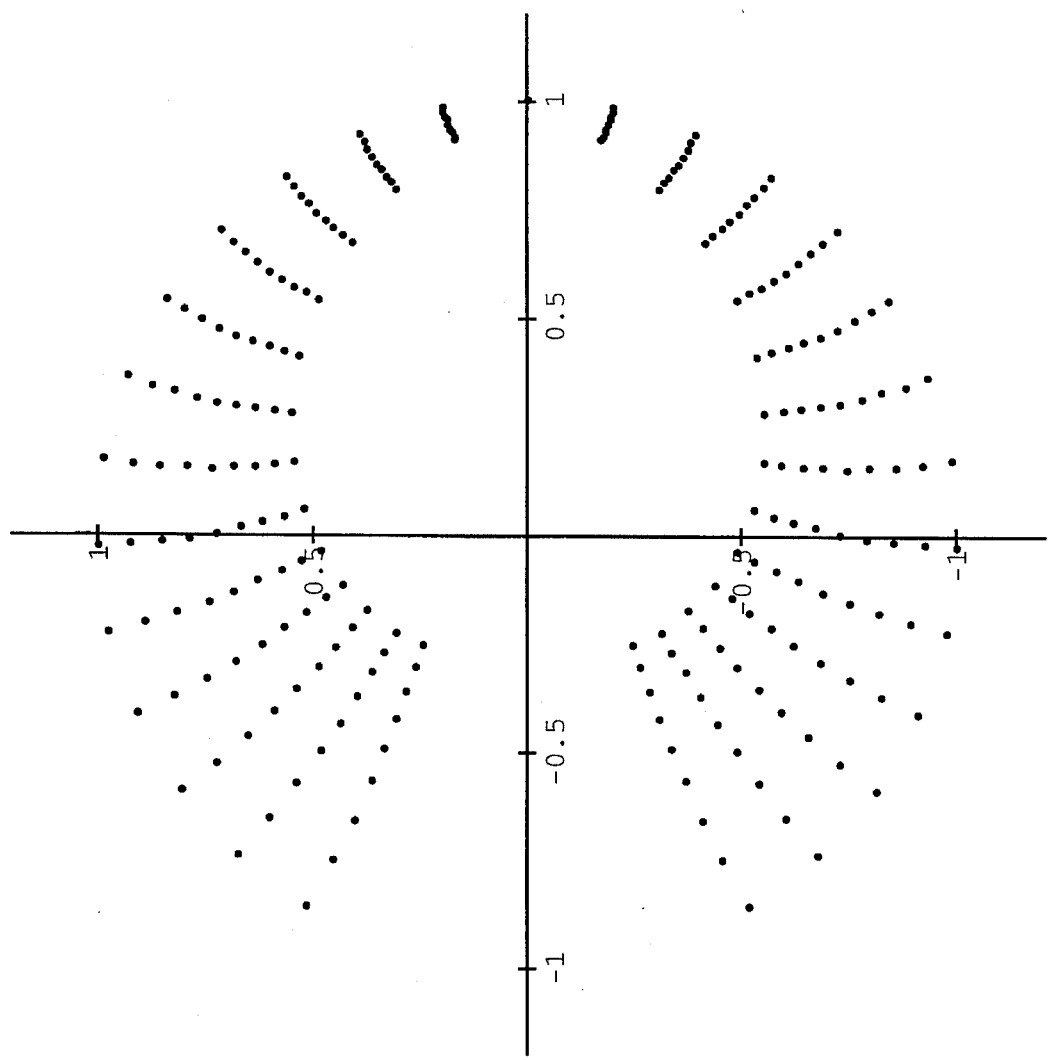
FIG. 3 is a plot in the complex plane illustrating the constellation of pole pairs for an ideal filter form for use in a cochlea model.

FIG. 3 is a plot illustrating a constellation of pole pairs for a digital filter that conforms to the definition of frequency and damping according to the impulse invariance method as described above. This plot may be taken as an ideal, though it is not the only possible idealization for a mapping from frequency and damping parameters to pole positions. The pole pairs shown correspond to frequencies ranging from 0.2 to 2.6 radians per sample in increments of 0.2, while the damping is incremented in steps of 0.05 from 0.0 to 0.7 for each of these frequencies. In the case of the use of such a filter in a cochlea model, it is ideally desirable to vary the damping parameter without affecting the frequency. Whereas, in other applications, such as speech synthesis, it may be desirable to be able to vary the frequency without affecting the damping. In general, having independent control of these two dimensions is often desirable, and is one object of the present invention.

Figure 4:
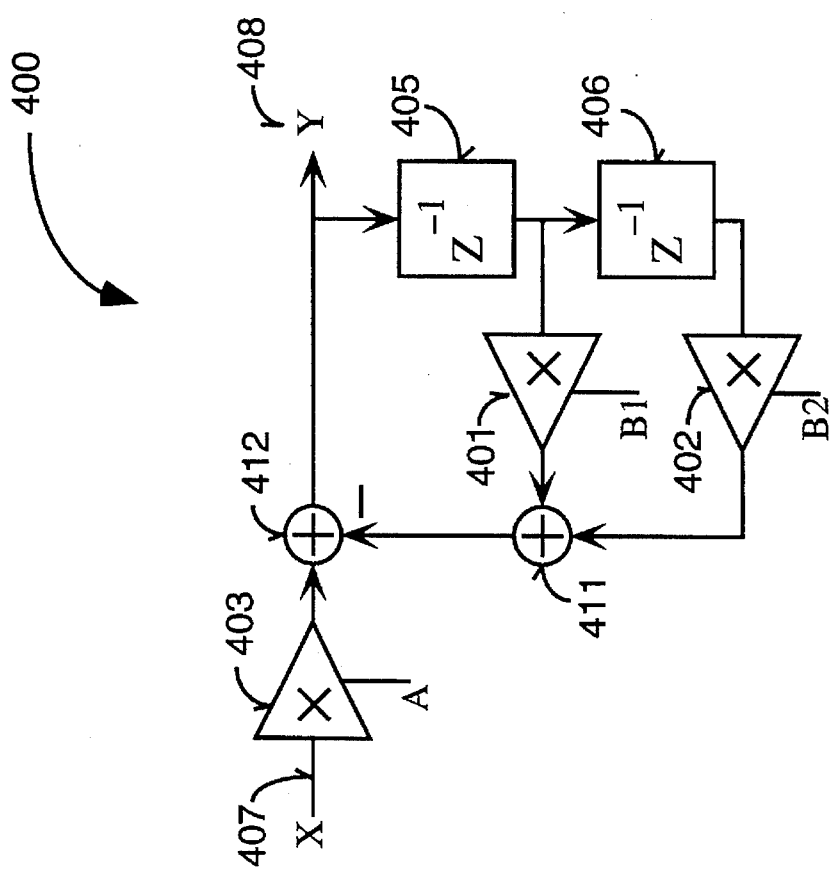
FIG. 4 is a block diagram illustrating a prior art second-order canonic form digital filter.

FIG. 4 is a diagram of a digital filter known as a direct form or canonic form filter. The sequence X of signal values at input 407 to filter 400 is processed by multipliers and adders and delays to produce a sequence Y of signal values at output 408. Filter 400 is canonic in the sense that it requires only two multipliers 401 and 402 to determine two pole locations. The third multiplier 403 allows independent application of a gain parameter, A, and can optionally be omitted. Adder 411 combines feedback paths from multipliers 401 and 402. Adder 412 combines the forward path from multiplier 403, with a weight of positive one, with the feedback sum from adder 411, with a weight of negative one. In general, an operator such as that of adder 412 is referred to as an adder or a summing means, with the possibility of negative weight or subtraction operation at one or more inputs to the adder. State storage memories or delays 405 and 406 are connected to temporarily store previous values of the output sequence Y for use in computing new output values.

The operation of filter 400 is represented by the difference equation $Y_n = AX_n - B_1 Y_{n-1} - B_2 Y_{n-2}$. The subscripts denote the time index of signal values. Subscript n relates to the current time for which an output value is being computed from a current input value. Subscripts n-1 and n-2 denote times of previously computed output values, available at the outputs of delay blocks 405 and 406. The operation of filter 400 is also described by the z-transform transfer function $Y(z)/X(z) = A/(z^2 + B_1 z + B_2)$. The roots of the denominator polynomial $(z^2 + B_1 z + B_2)$ determine the pole locations in the z-plane, which lie at a z-plane location with a radius r=sqrt($B_2$), where sqrt is the square root function, and real part Re[z]=$-B_1/2$. Thus, the filter coefficients independently control the radius and the real part of the poles.

Figure 5:
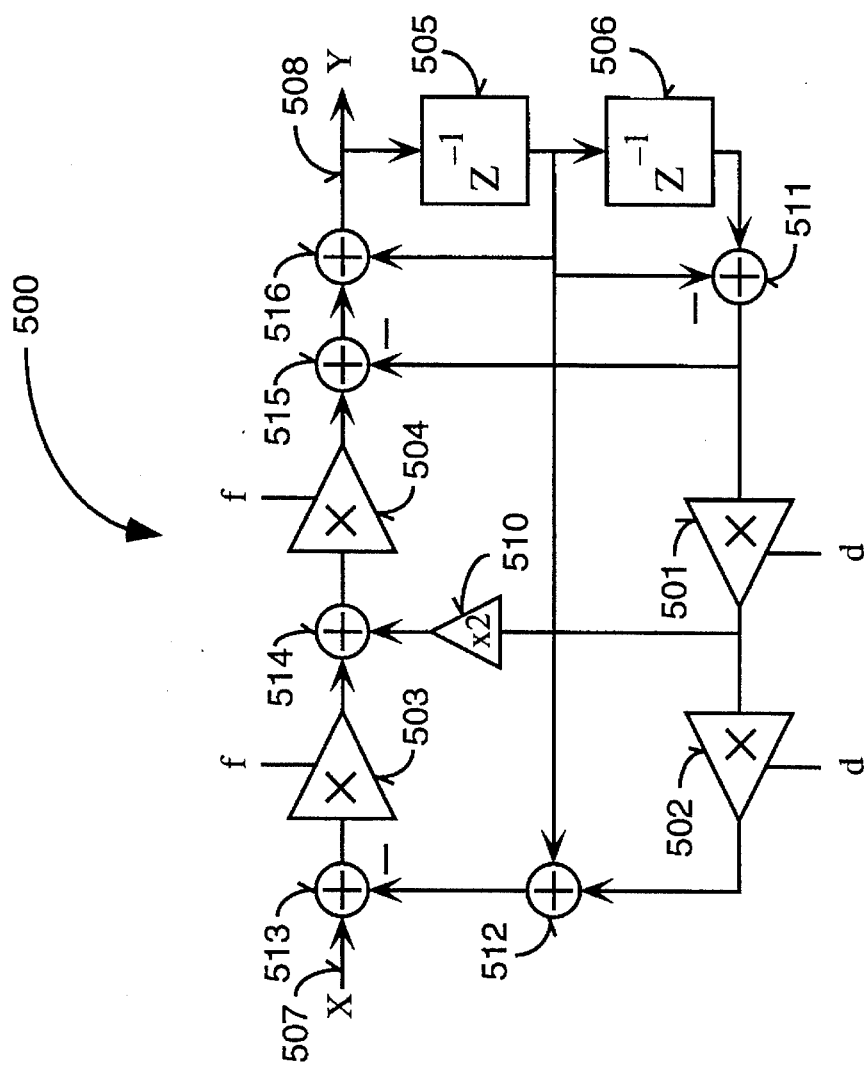
FIG. 5 is a block diagram illustrating a digital filter network of the currently preferred embodiment of the present invention.

FIG. 5 is a diagram of a preferred embodiment of a digital filter of the present invention. The sequence X of signal values at input 507 to filter 500 is processed by multipliers and adders and delays as shown to produce a sequence Y of signal values at output 508. Filter 500 is not canonic, since it uses more than two multipliers to determine two pole locations. State storage memories or delays 505 and 506 are connected to temporarily store previous values of the output sequence Y for use in computing new output values. Multipliers 501–504, doubler 510, and adders 511–516 are connected as shown to produce a filter that may be seen, by tracing signal flow paths, to implement the following difference equation:

$$Y_n = AX_n + (1-f^2)Y_{n-1} - (1 - 2df + d^2 f^2)(Y_{n-2} - Y_{n-1})$$

The detailed structure and operation of filter 500 and a rationale for its design and for its difference equation are described in more detail in paragraphs that follow.

The s-plane pole positions of a continuous-time filter are specified by s=(−d+j sqrt(1−$d^2$))f and its complex conjugate, where j=sqrt(−1). Mapping via the impulse invariance transformation yields the ideal z-plane pole locations as z=exp(s)=exp((−d+j sqrt(1−$d^2$))f) and its conjugate, which are at radius r=exp(−df) and at angle q=sqrt(1−$d^2$) in the z-plane. Relating the pole positions in terms of d and f to the pole positions in terms of canonic form coefficients, $B_1$ and $B_2$, results in the following ideal specification:

$$B_1 = -2 \exp(-df)\cos(\mathrm{sqrt}(1-d^2))$$

$$B_2 = \exp(-2df)$$

One approach to control such a filter by means of damping and frequency parameters, d and f, is to compute the feedback coefficients, $B_1$ and $B_2$, from d and f using a specialized parameter-to-coefficient block according to the above equations. Rather than use the mathematical definition involving complex exponentials, trigonometric functions, and square roots, it is possible to approximate the ideal filter form by deriving a Taylor series or other polynomial expansion of the ideal coefficients. The polynomial form allows the coefficients to be computed using a modest number of multiplies and adds. For example, if the coefficients are expanded as a series about zero frequency and zero damping to second order in frequency and first order in damping, the following approximations are derived:

$$B_1 = -2 + 2df + f^2$$

$$B_2 = 1 - 2df$$

Figure 6A:
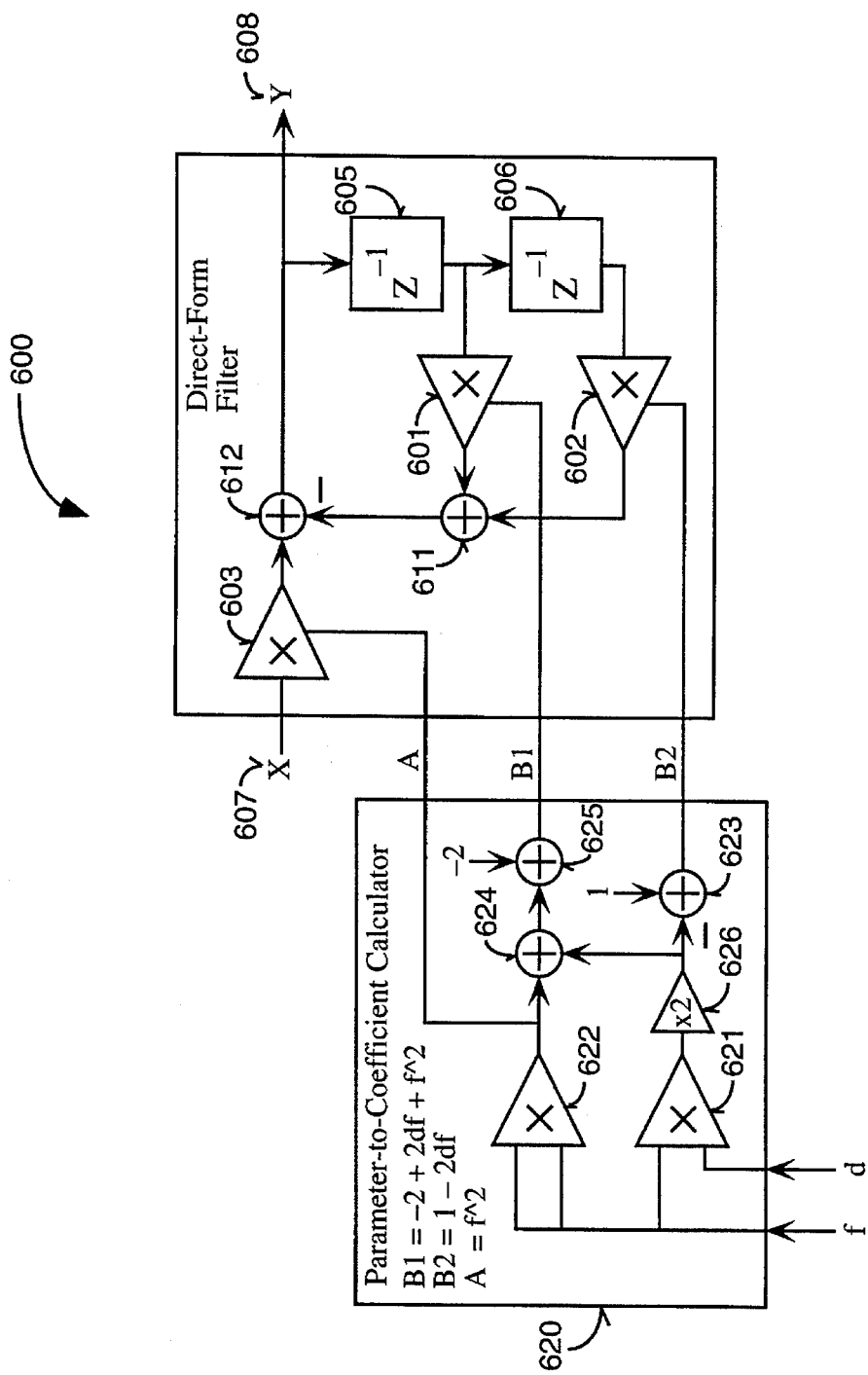
FIG. 6A is a block diagram illustrating a second-order canonic form digital filter controlled by a parameter-to-coefficient block.
Figure 6B:
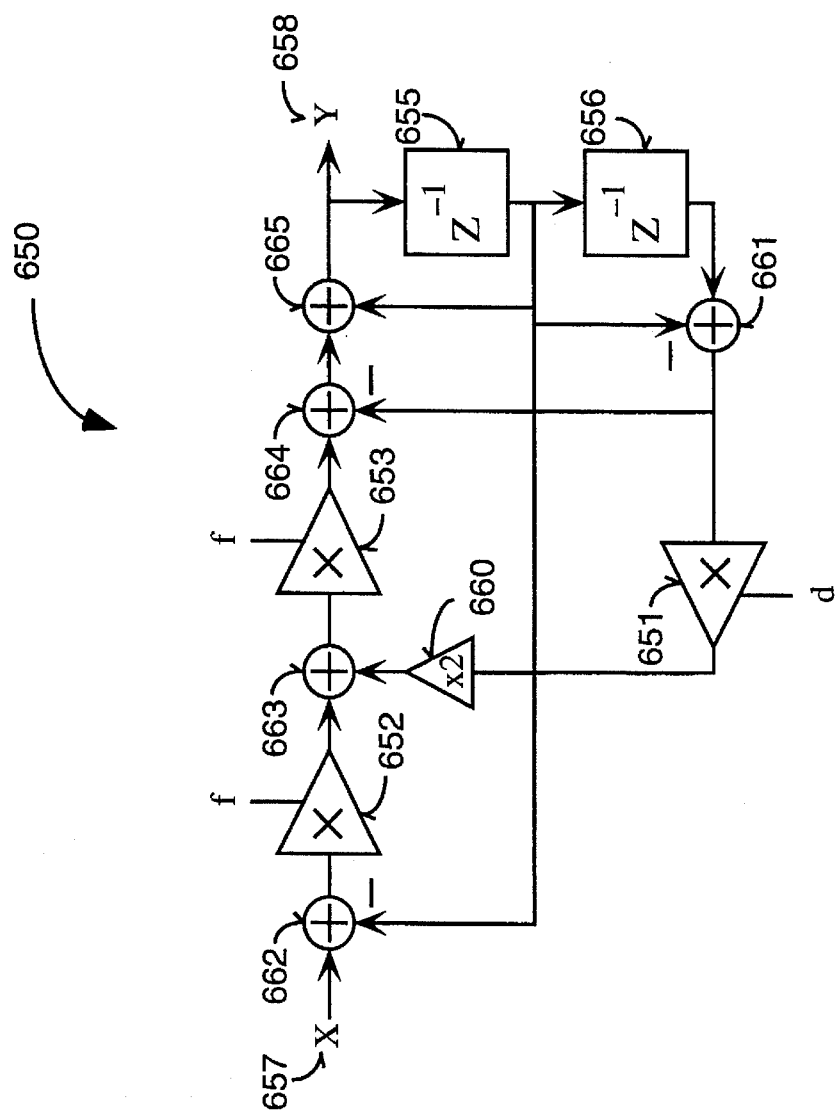
FIG. 6B is a block diagram illustrating a non-canonic digital filter directly controlled by the damping and frequency parameters.

FIGS. 6A and 6B are diagrams of two equivalent realizations of a filter with independent frequency and damping parameters according to the above approximation. FIG. 6A shows a canonic-form filter 600 controlled by a parameter-to-coefficient block 620. The sequence X of signal values at input 607 to filter 600 is processed by multipliers 601–603 and 621–622 and adders 611–612 and 623–625 and delays 605–606 as shown to produce a sequence Y of signal values at output 608. State storage memories or delays 605 and 606 are connected to temporarily store previous values of the output sequence Y for use in computing new output values. Parameter-to-coefficient block 620 computes coefficients $B_1$ and $B_2$ according to the above equations, using multipliers and adders as shown.

FIG. 6B shows a non-canonic filter 650 in which the parameters d and f are used directly as coefficients to effect the difference equation and hence, the transfer function. The sequence X of signal values at input 657 to filter 650 is processed by multipliers 651–653, adders 661–665, and delays 655–656 as shown to produce a sequence Y of signal values at output 658. State storage memories or delays 655–656 are connected to temporarily store previous values of the output sequence Y for use in computing new output values. The structure of filter 650 may be understood by transforming the difference equation of filter 600 to a form that emphasizes the difference $Y_{n-2}-Y_{n-1}$ between the delayed output values:

$$Y_n = AX_n - (-2 + 2df + f^2)Y_{n-1} - (1 - 2df)Y_{n-2}$$

$$Y_n = AX_n + (1 - f^2)Y_{n-1} - (1 - 2df)(Y_{n-2} - Y_{n-1})$$

The above equation may be seen to represent filter 650, for the case $A = f^2$, by inspection of the various feedback paths through the multipliers and adders in FIG. 6B. From the point of view of signal flow graph theory, these filters are formally equivalent, but in terms of implementation cost, filter 650 has an advantage if the parameters d and f are not constant.

The DC gain of filter 600 may be determined by evaluating its transfer function, $Y(z)/X(z) = A/(z^2 + B_1 z + B_2)$, at the z-plane location corresponding to zero frequency, wherein $z=1$. This evaluation yields a DC gain of: $Y(0)/Z(0) = A/(1 + B_1 + B_2) = A/f^2$. It is often desirable to have a DC gain of unity. To achieve unity DC gain, the input is multiplied by $A = 1 + B_1 + B_2 = f^2$ as shown. In the case of filter 650, because of the way the multipliers are arranged, it is possible to apply the input through a gain of $f^2$ without using any additional multipliers.

The input could also be added into any other part of the network to achieve some other gain, and an explicit gain multiplier could be added before or after the filter if needed for more generality. In the direct-form filter, it is conventional but not strictly necessary to use an additional multiplier to achieve unity gain. Unity gain could also be achieved by adding the input in at three different places such that the total effective instantaneous gain from the input to the output is $1 + B_1 + B_2$.

Figure 7A:
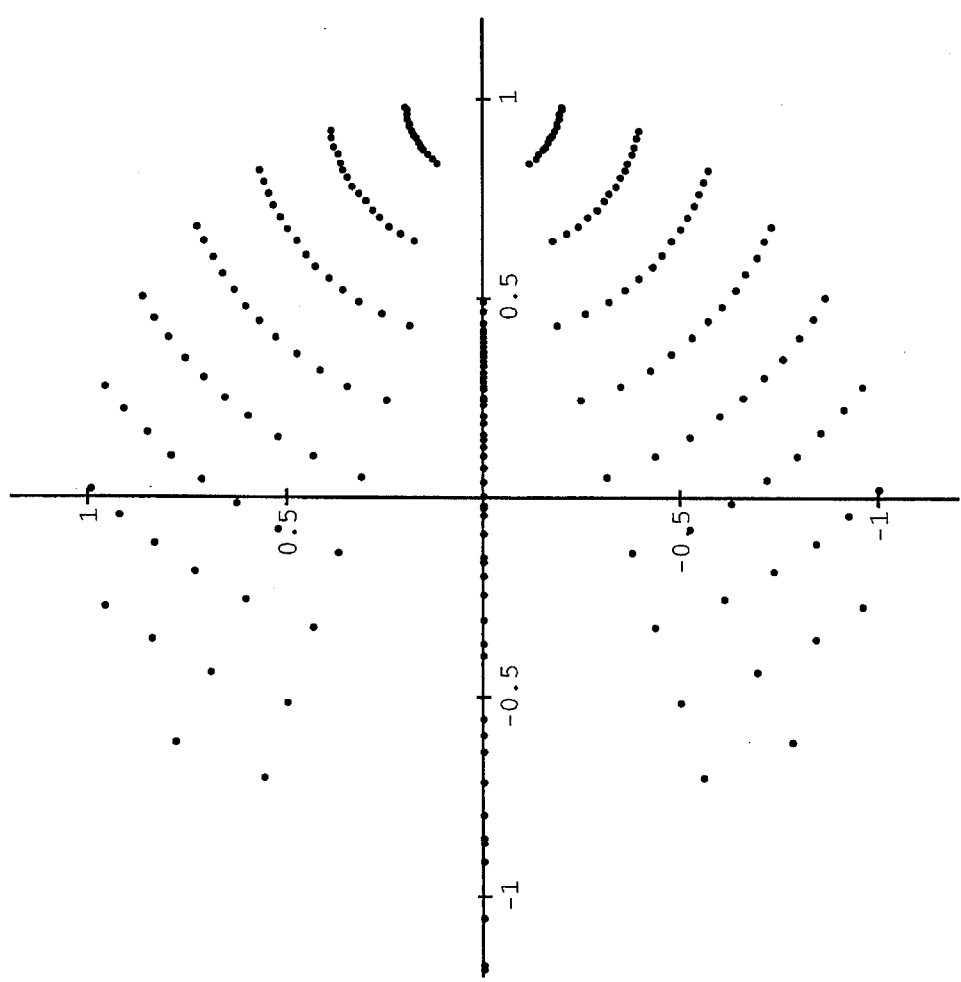
FIG. 7A is a plot illustrating a constellation of pole pairs for the filters of FIG. 6.

FIG. 7A is a plot illustrating a constellation of poles in the z-plane for filters 600 and 650. The parameter d is varied from 0.0 to 0.7 in increments of 0.05, and the parameter f is varied from 0.2 to 1.8 in increments of 0.2. The circle bounding all the pole positions shown is the unit circle specified by $|z|=1$; pole positions on this circle correspond to undamped filters, or $d=0$. Note the spurious poles along the x-axis, especially at higher frequencies, and the general distortion of the array of pole positions relative to the ideal constellation as shown in FIG. 3, which are due to the rather poor approximation of the low-order Taylor series.

Figure 7B:
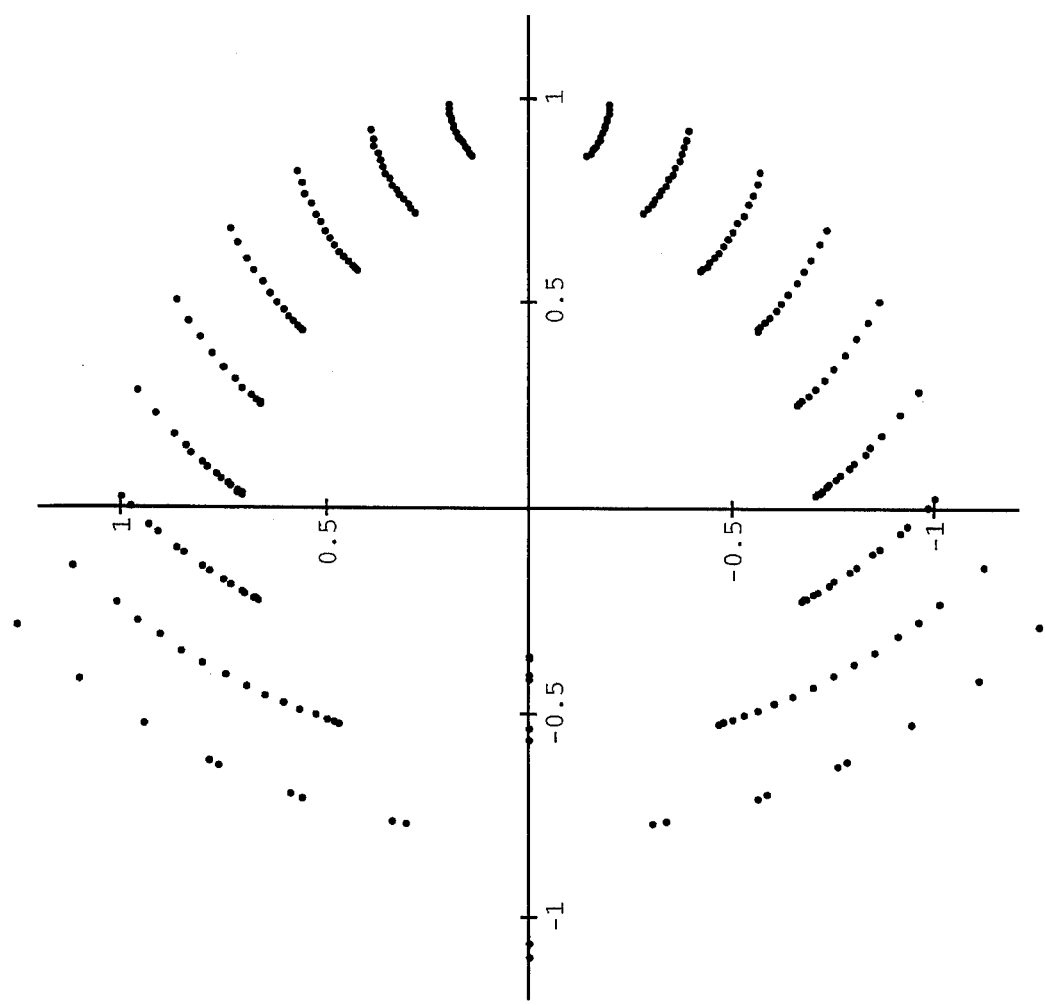
FIG. 7B is a plot illustrating a constellation of pole pairs of the present invention with second-order damping correction according to a Taylor series approximation.
Figure 7C:
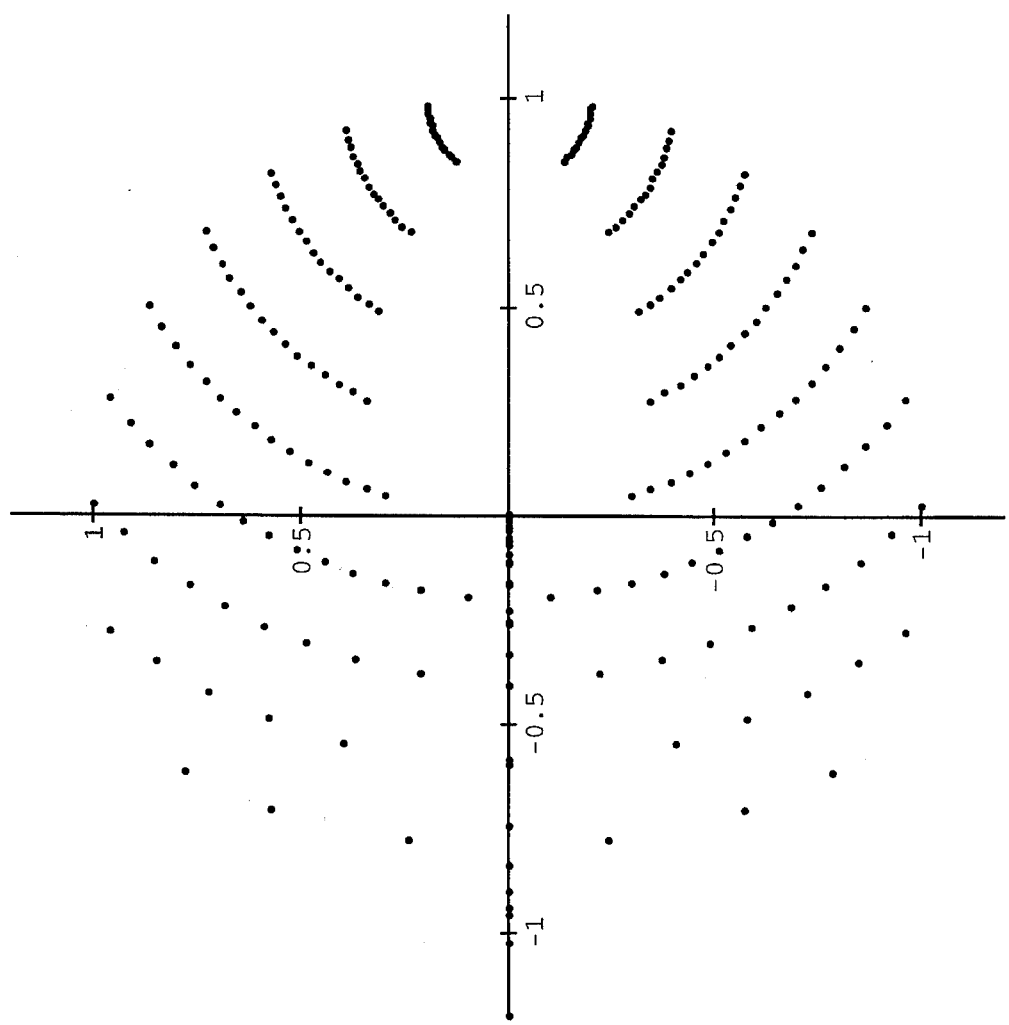
FIG. 7C is a plot illustrating a constellation of pole pairs of the currently preferred embodiment of the present invention with half as much second-order damping correction.

FIGS. 7B and 7C are corresponding plots for filters according to the present invention. FIG. 7B shows a plot of a filter using higher-order polynomial approximations according to a Taylor series. FIG. 7C shows a plot of a filter having a polynomial with less second-order damping correction corresponding to filter 500. Note that a higher-order Taylor series expansion is not necessarily a better approximation under all circumstances. Some of the pole positions shown in FIG. 7B are actually at radii greater than one in the z-plane. The significance of this is that the filters are unstable.

The constellation of FIG. 7C is similar to the ideal plot shown in FIG. 3, especially for the range of interest near $z=1$ (i.e., corresponding to $f<1$) regarding the cochlea model. Unlike the direct form, which has sparse pole positions in the low frequency region near $z=1$ when coefficients $B_1$ and $B_2$ are quantized to a finite precision, filter 500 has a well distributed constellation pattern when d and f are quantized. This quality renders filter 500 suitable for accurately modeling the low frequency response of the basilar membrane.

Filter 500 and its response, as illustrated by the constellation plot of FIG. 7C, are not derived from a Taylor series. If the ideal coefficients $B_1$ and $B_2$ are expanded as a Taylor series about zero frequency and zero damping, to second order in frequency and second order in damping, the following approximations result:

$$B_1 = -2 + 2df + f^2 - 2d^2 f^2$$

$$B_2 = 1 - 2df + 2d^2 f^2$$

The corresponding difference equations are given as follows:

$$Y_n = AX_n - (-2 + 2df + f^2 - 2d^2 f^2)Y_{n-1} - (1 - 2df + 2d^2 f^2)Y_{n-2}$$

$$Y_n = AX_n + (1 - f^2)Y_{n-1} - (1 - 2df + 2d^2 f^2)(Y_{n-2} - Y_{n-1})$$

Note that the addition of the $2d^2 f^2$ term due to the second order expansion in d is the only difference in the equations leading to the difference in pole positions between FIGS. 7A and 7B. This causes a general over-correction, thereby changing the generally overdamped characteristic of FIG. 7A to the generally underdamped characteristic of FIG. 7B. The currently preferred embodiment of the present invention, as represented in FIG. 5, lies half way between these two implementations. Half as much second order damping correction is utilized, as shown by the following approximation:

$$B_1 = -2 + 2df + f^2 - d^2 f^2$$

$$B_2 = 1 - 2df + d^2 f^2$$

$$Y_n = AX_n - (-2 + 2df + f^2 - d^2 f^2)Y_{n-1} - (1 - 2df + d^2 f^2)Y_{n-2}$$

The above difference equation corresponds to a canonic form filter with coefficients provided by a parameter-to-coefficient block according to the above expressions for coefficients $B_1$ and $B_2$. It is algebraically equivalent to the following difference equation:

$$Y_n = AX_n + (1 - f^2)Y_{n-1} - (1 - 2df + d^2 f^2)(Y_{n-2} - Y_{n-1})$$

The latter form of the difference equation, emphasizing the difference $Y_{n-2} - Y_{n-1}$ of previous output values, can be related to the structure of Filter 500, for the case $A = f^2$, by inspection of the various feedback paths through the multipliers and adders in FIG. 5. Notice that the placement of the input leads to unity gain at DC. This is equivalent to $A = f^2$, as in filter 650.

The preferred embodiment of the discrete-time filter 500 of the present invention can also be implemented via software control of a programmable computing engine. It can likewise be implemented in a more direct hardware version of the filter flow diagram. The following program code is an example of the source version of the sample-update calculation of a software version of filter 500.

```
T1=Z2−Z1

T2=T1*D

Y=Z1−T1+F*(T2+T2+F*(X+D*T2−Z1)

Z2=Z1

Z1=Y
```

The state variables Z1 and Z2 are used to represent the two delay elements (i.e., the previous output values). The variable X represents the current input value, and the variable Y represents the current output value. The variables D and F represent the current damping and frequency parameters. Variables T1 and T2 represent the difference of state values and the output of multiplier 501, respectively. Note that the update step uses only four multiplications and seven adds or subtracts, one of which (T2+T2) implements the x2 operation of filter 500. One skilled in the art of software implementations of digital signal processing will understand that a control loop is associated with this update step to take successive input values from a real-time input stream or from a storage array, to update D and/or F as required by the application, and to put successive output values out to a real-time output stream or to a storage array.

In an alternative embodiment, the present invention can be implemented in an Application Specific Integrated Circuit (ASIC), also known as an Application Specific Signal Processor (ASSP), such as a dedicated digital approximation of an analog cochlea model. These integrated circuits can be designed using a variety of methodologies. For example, a hierarchical synchronous bit-serial design methodology can be implemented. Depending on the system performance requirements and the speed of the IC technology, various degrees of parallelism are possible. For example, separate hardware multipliers and adders may be used for each multiplier and adder shown in the diagrams of the filters and AGC, circuits. Furthermore, those multipliers and adders may be shared or "multiplexed" over the plurality of channels of the model, using bit-serial delay lines each place a delay operator is shown, to hold the state of all the multiplexed channels.

A person skilled in the art of digital signal processing will understand that the foregoing description of the present invention is adequate for implementing it in a wide range of possible hardware, parallelism, control, and input/output styles. Other alternative embodiments of the present invention include filters with slightly modified structure, filters with zeros instead of or in addition to poles, and filters with higher-order polynomial approximations to the impulse-invariance or other idealization. Some of these alternative embodiments am described below.

Figure 8:
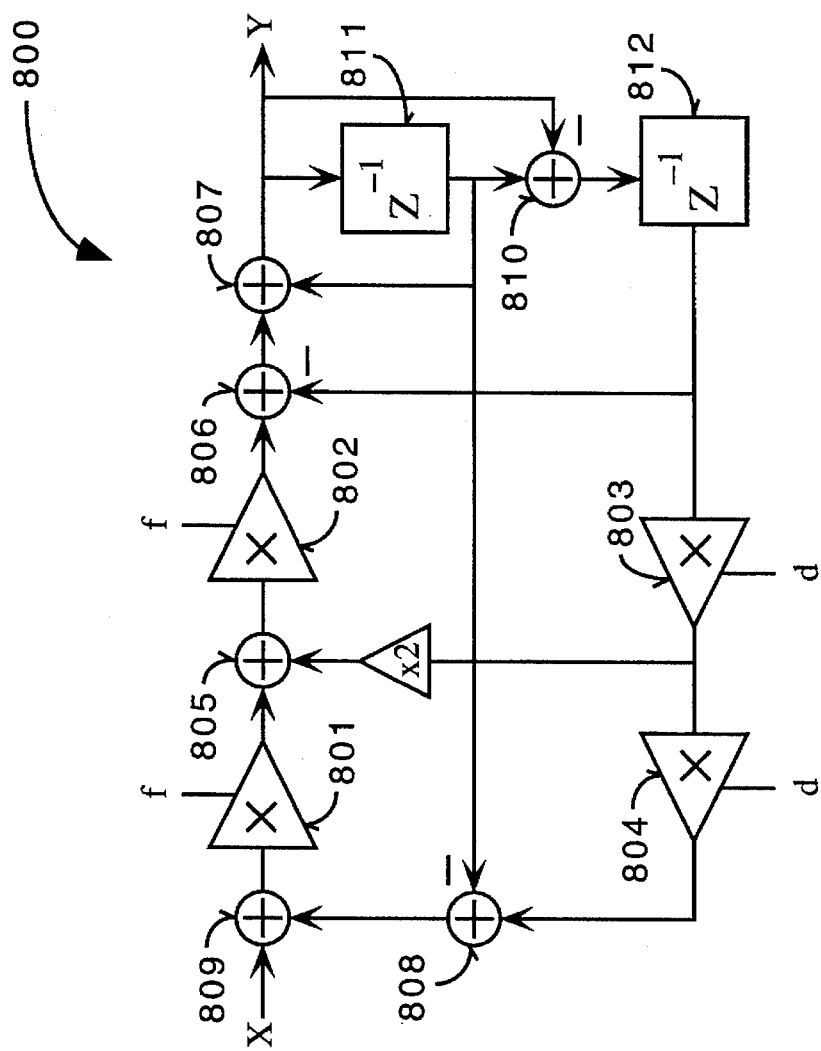
FIG. 8 is a block diagram illustrating an alternative embodiment of a digital filter network of the present invention, using "retiming."

FIG. 8 is a block diagram illustrating an alternative embodiment of a digital filter network of the present invention using "retiming." Retiming is a technique well-known in the digital signal processing art, wherein the order of delay operations and arithmetic operations is interchanged while the overall function of a filter or circuit is maintained. Filter 800 comprises four multipliers 801–804, six adders 805–810, and two delays 811–812. Filter 800 is equivalent to filter 500, but instead of storing two previous outputs in delay elements, it stores one previous output and the difference of two previous outputs. The order of delay and differencing has been interchanged, but the difference equation, transfer function, pole positions, and numerical precision properties are unchanged.

Figure 9:
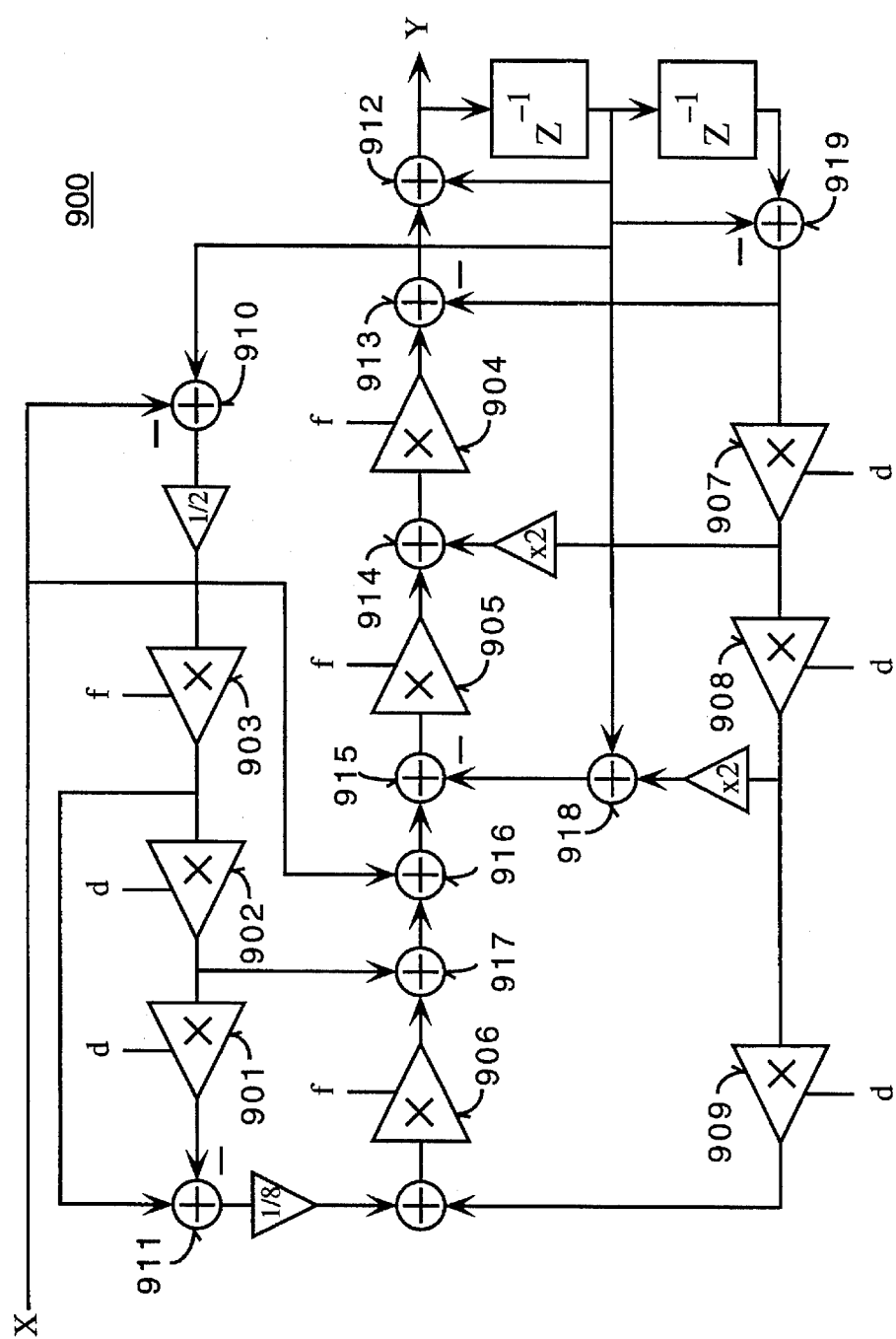
FIG. 9 is a block diagram illustrating another embodiment of a digital filter network of the present invention.

FIG. 9 is a block diagram illustrating a further enhanced and more complex digital filter network of the present invention, in which nine multipliers 901–909 and ten adders 910–919 are used in correlating the filter to the idealized constellation plot provided by the impulse-invariance transformation. Filter 900 has all the same elements as filter 500, plus more multipliers and adders that make little difference for small values of d and f, but which partially correct for the errors of the low-order polynomial approximation for larger values and d and f. Filter 900 implements the following approximate coefficients:

$$B_1 = -2 + 2df + f^2 - 2d^2f^2 + d^3f^3 - f^4/16 - df^2/2 + d^2f^4/16$$

$$B_2 = 1 - 2df + 2d^2f^2 - d^3f^3$$

There exist numerous polynomial approximations that are well-behaved to various degrees for various ranges of d and f. For example, instead of the 1/16 factor on the $d^2f^4$ term, other factors from 0 to 1/4 are useful. Another approximation of intermediate complexity is given as follows:

$$B_1 = -2 + 2df + f^2 - d^2f^2 - f^4/16 - df^2/2$$

$$B_2 = 1 - 2df + d^2f^2$$

The higher-order polynomials result in filter structures having higher complexity and cost. Nevertheless, they still exhibit the property of easily achieving a DC gain of exactly unity by appropriately connecting the input into more than one place so that the total gain of input paths is equal to $1B_1 + B_2$. Other input connections are possible within the scope of the present invention, for example, if a DC gain other than unity is desired. A person skilled in the art of digital arithmetic will understand that power-of-two factors such as 2, 1/2, 1/16, etc., used in the above approximations for $B_1$ and $B_2$ are easily implemented using shifts. Shifters are more economical to implement than multipliers.

Figure 10:
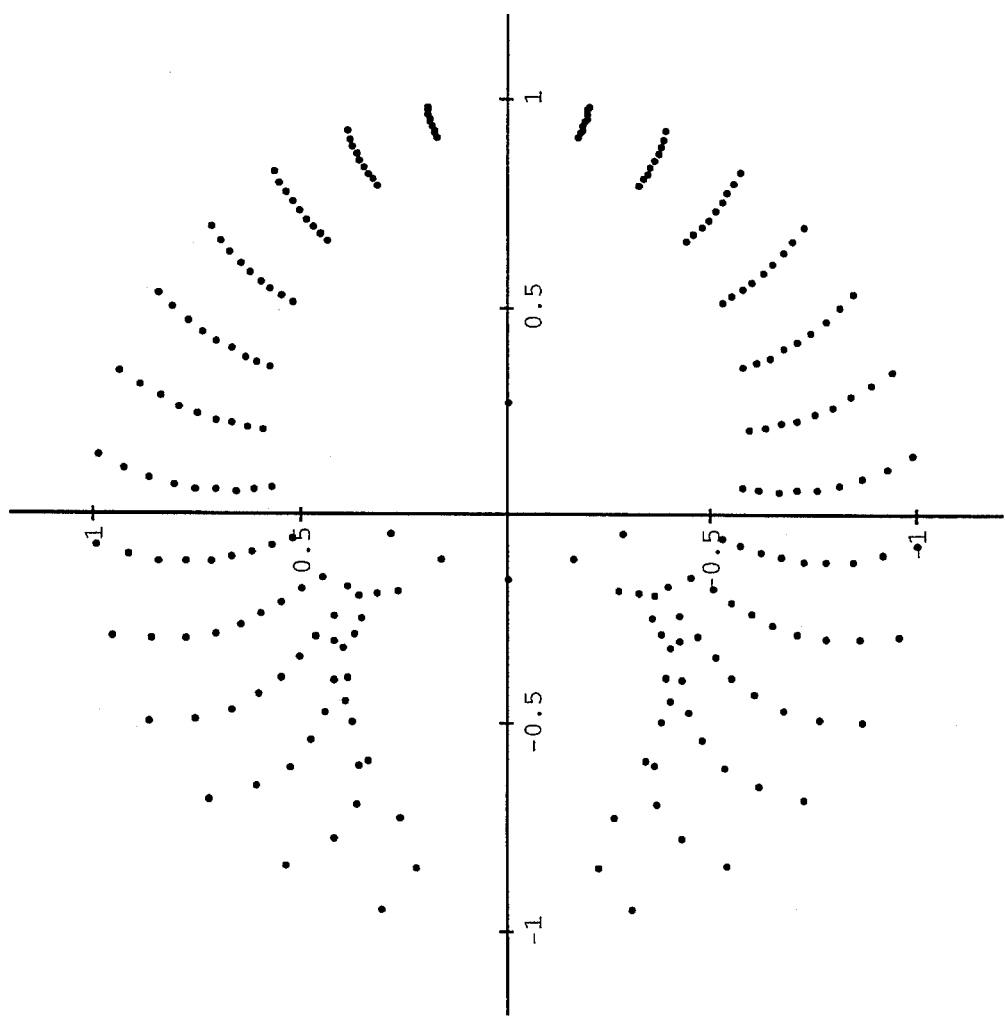
FIG. 10 is a plot illustrating the constellation of pole pairs for the filter form of FIG. 9 of the present invention.

FIG. 10 is a plot illustrating the constellation of pole pairs for the filter form shown in FIG. 9 of the present invention. It may be seen that the higher-order coefficient approximations that led to filter 900 result in less distortion of the frequency parameter, less overdamping at high frequencies, and less coupling of increasing d into increasing f at high frequencies. However, the parameters are still restricted to df<1 for complex poles because $B_2$, which controls the radius of the poles, goes to zero when df=1. The trajectories of increasing d for very high f are highly distorted relative to the ideal.

Figure 11:
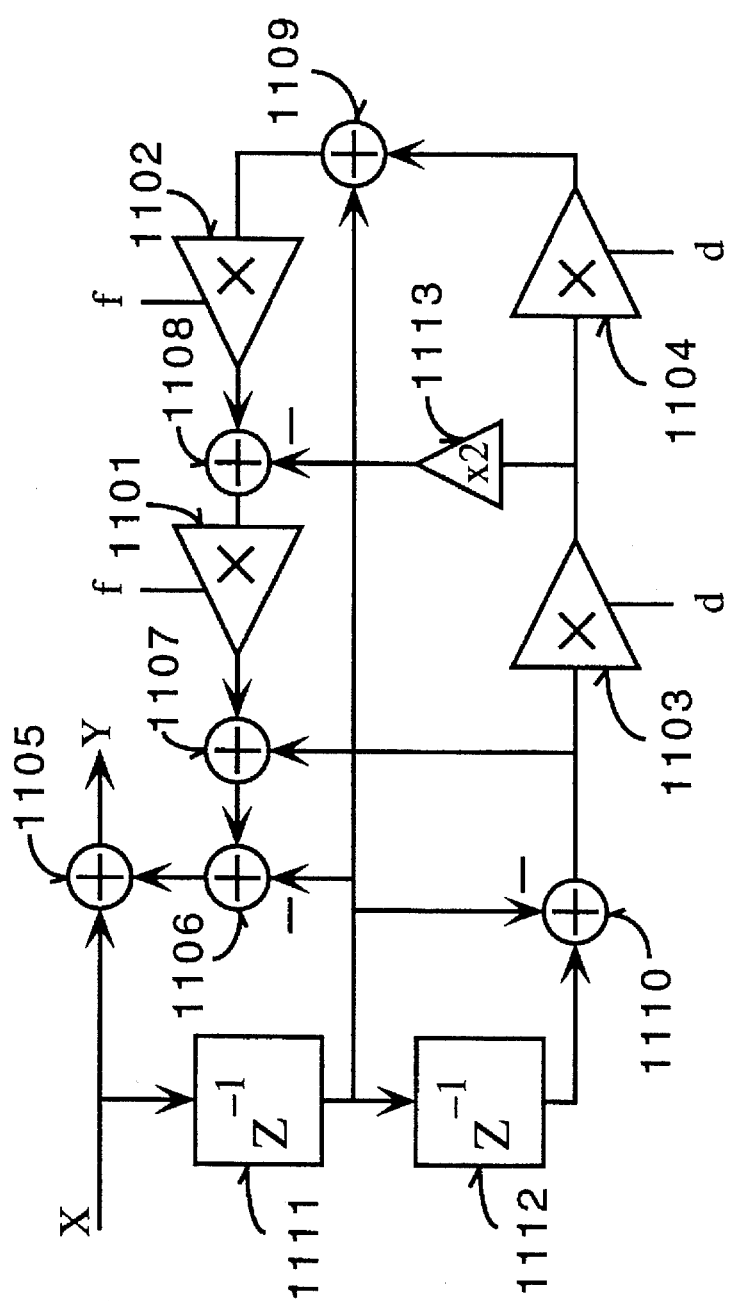
FIG. 11 is a block diagram illustrating a two-zero nonrecursive filter according to the present invention.

FIG. 11 is a block diagram illustrating a two-zero nonrecursive filter according to the present invention. Four multipliers 1101–1104, six adders 1105–1110, two delays 1111–1112, and a times two shifter 1113 are implemented. In the case of nonrecursive filters of the present invention, the z-plane transfer function is $Y(z)/X(z) = (z^2 + B_1 z + B_2)$, which has a gain of $(1 + B_1 + B_2) = f^2$ at DC. There is no simple way to achieve unity gain at DC in this case, as a division by $f^2$ is required.

Figure 12:
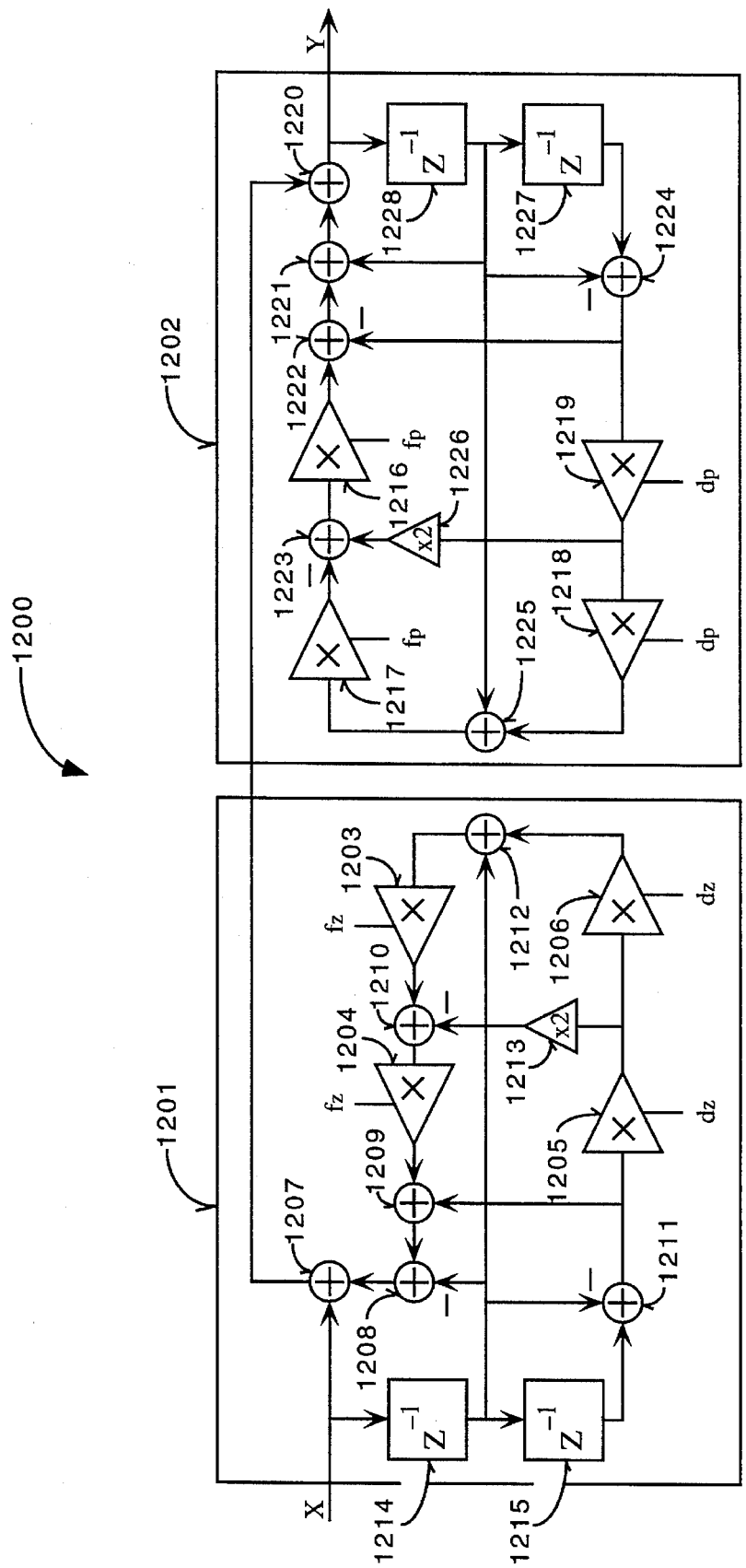
FIG. 12 is a block diagram illustrating a bi-quadratic filter according to the present invention, which is especially suitable as a notch filter.

FIG. 12 is a block diagram illustrating a bi-quadratic filter according to the present invention. Bi-quadratic filter 1200 has separate parameters, $d_z$ and $f_z$ for controlling the zeros and $d_p$ and $f_p$ for controlling the poles. Filter 1200 combines a nonrecursive filter stage 1201 and a recursive filter stage 1202. Non-recursive filter stage 1201 comprises multipliers 1203–1206, adders 1207–1212, shifter 1213, and delays 1214–1215. Recursive filter stage 1202 comprises multipliers 1216–1219, adders 1220–1225, shifter 1226, and delays 1227–1228. However, the input to the recursive filter is altered to achieve a different gain. The DC gain of filter 1200 is $f_z^2/f_p^2$.

In the common useful case of a notch filter, the frequencies of the poles and zeros are set to be equal, in which case the DC gain is again seen to be unity. For a very deep notch filter, it is sufficient to set the damping of the zeros to be zero. Such a filter can be further simplified by removing unneeded multipliers and adders.

It is also possible to arrange a recursive filter and a nonrecursive filter in the opposite order. By putting the recurslye filter first, the delay elements that store previous outputs of the recurslye section are also storing previous inputs of the nonrecursive section. Consequently, redundant delays may be removed. Such a structure is still within the scope of the present invention to the extent of either of its parts. In some applications, such as with notch filters, putting the poles before the zeros may result in a high gain to a large unwanted signal, thereby exacerbating scaling and dynamic range problems. In other applications, saving state storage will be an overriding advantage.

Thus, a digital filter having independent damping and frequency parameters is disclosed.

What is claimed is:

1. A filter for generating a sequence of output values in discrete time from a sequence of input values comprising:
   a direct-form filter controlled by a plurality of filter coefficients;
   a means for generating said filter coefficients as polynomial functions of a damping parameter signal and a frequency parameter signal by implementing multipliers and adders to combine said damping and frequency parameter signals, wherein said damping parameter signal and said frequency parameter signal are independently adjustable.

2. The filter of claim 1, wherein said generating means determines said coefficients comprising values $(-2+2df+f^2)$ and $(1-2df)$ from said damping and said frequency parameters.

3. The filter of claim 1, wherein said generating means determines said coefficients comprising values $(-2+2df+f^2-d^2f^2)$ and $(1-2df+d^2f^2)$ from said damping and said frequency parameters.

4. The filter of claim 1, wherein said generating means determines said coefficients comprising values $(-2+2df+f^2-d^2f^2-df^3/2f^4/16)$ and $(1-2df+d^2f^2)$ from said damping and said frequency parameters.

5. The filter of claim 1, wherein said generating means determines said coefficients which comprise $(-2+2df+f^2-2d^2f^2+d^3f^3-f^4/16-df^3/2+cd^2f^4)$ and $(1-2df+2d^2f^2-d^3f^3)$ from said damping and said frequency parameters and wherein said coefficient c ranges from zero to 0.25.

6. In a filter, a method of generating a sequence of output values in discrete time comprising the steps of:
   providing at least one damping parameter signal;
   providing at least one frequency parameter signal wherein said frequency parameter signal and said damping parameter signal are independently adjustable;
   controlling a direct form filter according to a plurality of filter coefficients;
   generating said filter coefficients as polynomial functions of said damping and frequency parameter signals by factoring said damping and frequency parameter signals into said direct form filter.

7. The method of claim 6, wherein said coefficients comprise values $-2+2df+f^2$ and $1-2df$.

8. The method of claim 6, wherein said coefficients comprise values $-2+2df+f^2-d^2f^2$ and $1-2df+d^2f^2$.

9. The method of claim 6, wherein said coefficients comprise values $-2+2df+f^2-d^2f^2-df^3/2-f^4/16$ and $1-2df+d^2f^2$.

10. The method of claim 6, wherein said coefficients comprise values $-2+2df+f^2-2d^2f^2+d^3f^3-f^4/16-df^3/2+cd^2f^4$ and $1-2df+2d^2f^2-d^3f^3$.

11. The method of claim 10, wherein the coefficient c ranges from zero to 0.25.

12. A filter for generating a sequence of output values in discrete time from a sequence of input values, comprising:
    a direct form filter coupled to receive a plurality of filter coefficients; and
    a coefficient calculating circuit coupled to receive independently adjustable damping and frequency parameter signals, said coefficient calculating circuit being operative to generate said filter coefficients as a function of said damping and frequency parameter signals.

13. The filter of claim 12, wherein said function is a polynomial function.

14. The filter of claim 12, wherein said coefficient calculating circuit comprises a plurality of multipliers and adders.

* * * * *